United States Patent [19]

Liautaud et al.

[11] Patent Number: 4,587,593
[45] Date of Patent: May 6, 1986

[54] INTEGRALLY CAST MOBILE RADIO HOUSING

[75] Inventors: James P. Liautaud, River and Bluff Rds., Trout Valley, Cary, Ill. 60013; Peter F. Stultz, Elgin; David L. Maloney, Barrington, both of Ill.

[73] Assignee: James P. Liautaud, Cary, Ill.

[21] Appl. No.: 529,858

[22] Filed: Sep. 6, 1983

[51] Int. Cl.⁴ .......................... H05K 7/20; H05K 5/06
[52] U.S. Cl. .................... 361/383; 361/395; 361/399
[58] Field of Search ............... 361/383, 384, 386, 395, 361/399, 422; 174/16 R, 15 R; 339/17 R, 17 C, 17 CM, 17 M, 112 R, 112 L, 113 R; 165/80 B, 80 C, 80 D

[56] References Cited

U.S. PATENT DOCUMENTS

| 2,777,893 | 1/1957 | Rosso | 361/399 |
| 2,882,479 | 4/1959 | Diebold | 361/383 |
| 3,475,656 | 10/1969 | Hepker | 361/391 |
| 3,904,812 | 9/1975 | Daffron | 361/395 |
| 4,310,876 | 1/1982 | Hia et al. | 361/399 |
| 4,317,952 | 3/1982 | Armor et al. | 361/385 |
| 4,388,672 | 6/1983 | Skill | 361/395 |

FOREIGN PATENT DOCUMENTS 2052164 1/1981 United Kingdom ............... 361/383

OTHER PUBLICATIONS

Chu, "IBM Technical Disclosure Bulletin", vol. 8, No. 11, 4/76, p. 1692.

Primary Examiner—A. D. Pellinen
Assistant Examiner—Greg Thompson
Attorney, Agent, or Firm—Lockwood, Alex, FitzGibbon & Cummings

[57] ABSTRACT

A housing for an electronic circuit board includes a housing member and identical top and bottom cover members. Inwardly extending ribs located on the interior sidewalls of the housing member align and support the circuit board, and provide convection cooling channels which allow air to circulate freely over the circuit board. The housing member is preferably an integrally cast member formed with integral fin surfaces which dissipate heat for the protection of temperature sensitive electronic components within the housing.

6 Claims, 6 Drawing Figures

INTEGRALLY CAST MOBILE RADIO HOUSING

BACKGROUND OF THE INVENTION

The present invention is directed generally to radio and electronic equipment enclsoures, and more particularly to an equipment housing for mobile radios and the like wherein integral circuit board mounting means provide improved heat dissipation.

Mobile radio transceivers and other vehicle-mounted electronic devices are often required to operate in adverse vehicular environments wherein they may be subjected to moisture, dust, grease and other contaminants, in addition to vehicle shock and vibration, in the course of normal operation. Furthermore, it is often necessary that such mobile devices be removed from the vehicle, either for operation in another vehicle, for operation in a portable mode, or for repair or adjustment. Consequently, it is necessary that the housings of such devices be designed and manufactured to protect the circuitry of the devices in the face of severe shock and adverse outside environments. Furthermore, it is necessary that the housings not include apertures which would admit contaminants to the circuitry of the device, while providing necessary heat dissipation for internal components, such as power rectifiers.

The present invention provides a die-cast electronic equipment housing which performs the dual functions of protecting electrical circuitry and providing necessary heat dissipation. The housing comprises only five elements which are die-cast from only three separate molds, and which when assembled serve both as a housing and as an integral heat dissipating structure.

SUMMARY OF THE INVENTION

An electronic equipment housing comprising a circuit board having electrical circuitry thereon which dissipates heat, and a housing member having a plurality of sidewalls defining a compartment having an opening at one end for receiving said circuit board. Cover means overlie the opening to close the compartment, and mounting means mount the circuit board within the compartment. The mounting means include a plurality of ribs integrally formed in the housing member on the inside surface of at least one of the sidewalls, each of the ribs projecting from the inside surface into engagement with the periphery of the circuit board so as to space the circuit board from the surface to form a plurality of convective air passages between the circuit board and the surface allowing air to flow from one side of the circuit board to the other.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Figure 1:
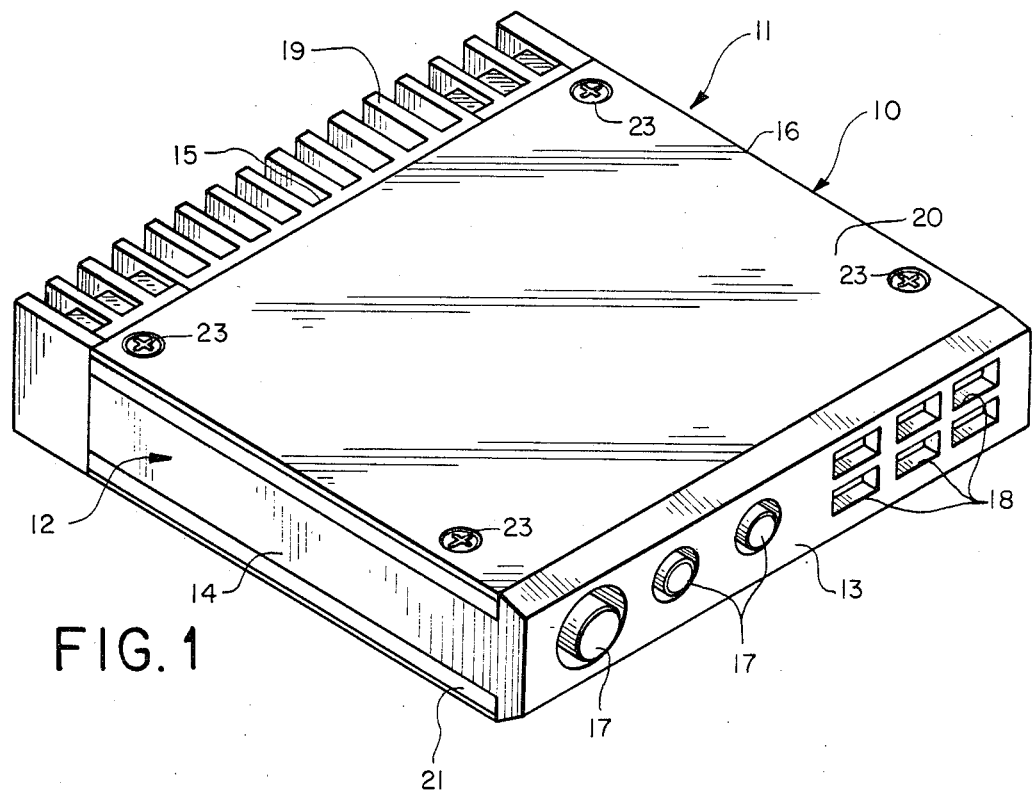
FIG. 1 is a front perspective view of a mobile radio transceiver incorporating a housing constructed in accordance with the invention.
Figure 2:
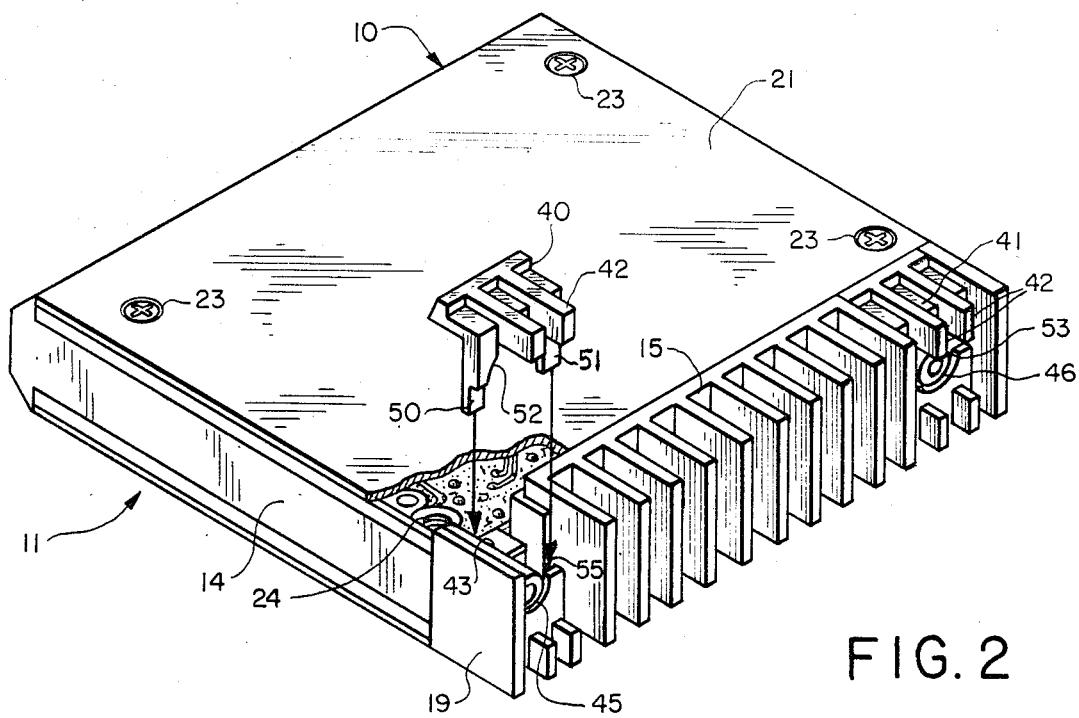
FIG. 2 is a rear perspective view of the bottom of the housing partially exploded to show the bottom cover plate and a connector retaining member of the housing, and a portion of the printed wiring board of the radio transceiver.

Referring to the drawings, and particularly to FIGS. 1 and 2, a housing 10 constructed in accordance with the invention is shown for use in conjunction with a mobile transceiver 11. The housing includes a one-piece generally rectangular housing member 12 having having a front sidewall 13, a left sidewall 14, a rear sidewall 15, and a right sidewall 16. Apertures in sidewall 13 accommodate three user-actuable controls 17 and six user-viewable indicator lamps 18.

The sidewalls 14 and 16, which preferably are solid, may include integral rails or other means by which the transceiver 11 can be mounted in a vehicle mounting tray (not shown). The rear sidewall 15 preferably includes a plurality of parallel-spaced outwardly projecting ribs 19 for the purpose of improving heat dissipation from the housing.

Figure 3:
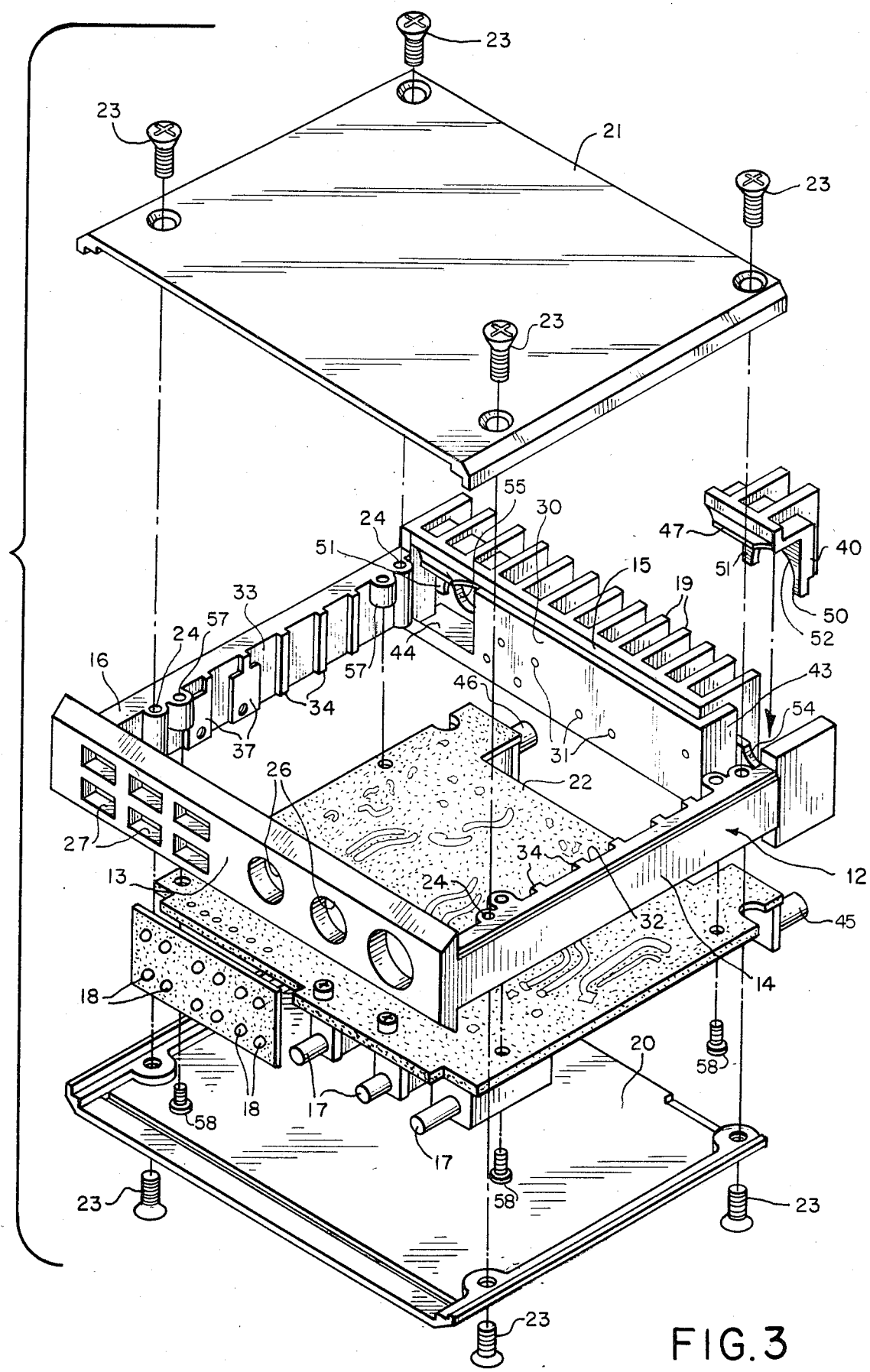
FIG. 3 is an exploded perspective view taken from the underside of the housing showing the circuit board of the transceiver and the principal components of the housing.

The housing member 12 is preferably cast or formed as a one-piece component from a metal or other heat-conductive impact-resistant material. As shown in FIG. 3, the housing member is open at its top and bottom surfaces. A pair of identical top and bottom cover plates 20 and 21 are mounted over the top and bottom surfaces to form an enclosure within which a circuit board 22 is contained. Components of the mobile transceiver 11 are mounted on circuit board 22 and interconnected in a manner well known to the art. The covers, which may also be cast or otherwise formed of a metallic material, are secured by a plurality of machine screws 23 threaded into apertures 24 in housing member 12.

When machine screws 23 are removed, the covers can be lifted free of housing member 12 to expose the top and bottom surfaces of circuit board 22 for repair or adjustment without disturbing the user-actuated controls or external connections of the circuit board. Since the cover members are identical, a savings is realized in the cost of manufacturing and assembling the housing.

The front sidewall 13 of housing member 12 includes three apertures 26 for accommodating controls 17, and six apertures 27 for accommodating indicator lamps 18. It will be appreciated that the particular number, grouping and form of the various controls and apertures associated with front sidewall 13 do not constitute a feature of the present invention, and depending on the requirements of the particular electronic device contained within the housing, may take forms different from those shown.

The front sidewall 13 and rear sidewall 15 of housing member 12 are of greater thickness than sidewalls 14 and 16, and in practice may be double the thickness. Rear sidewall 15 provides a bulkhead surface 30 on which heat dissipating electronic components of transceiver 11 are mounted. A plurality of threaded apertures 31 are provided on the surface of this purpose. The fins 19 projecting outward from the exterior surface of rear sidewall 15 are integrally cast with the wall so as to more efficiently dissipate heat absorbed by the housing.

Figure 4:
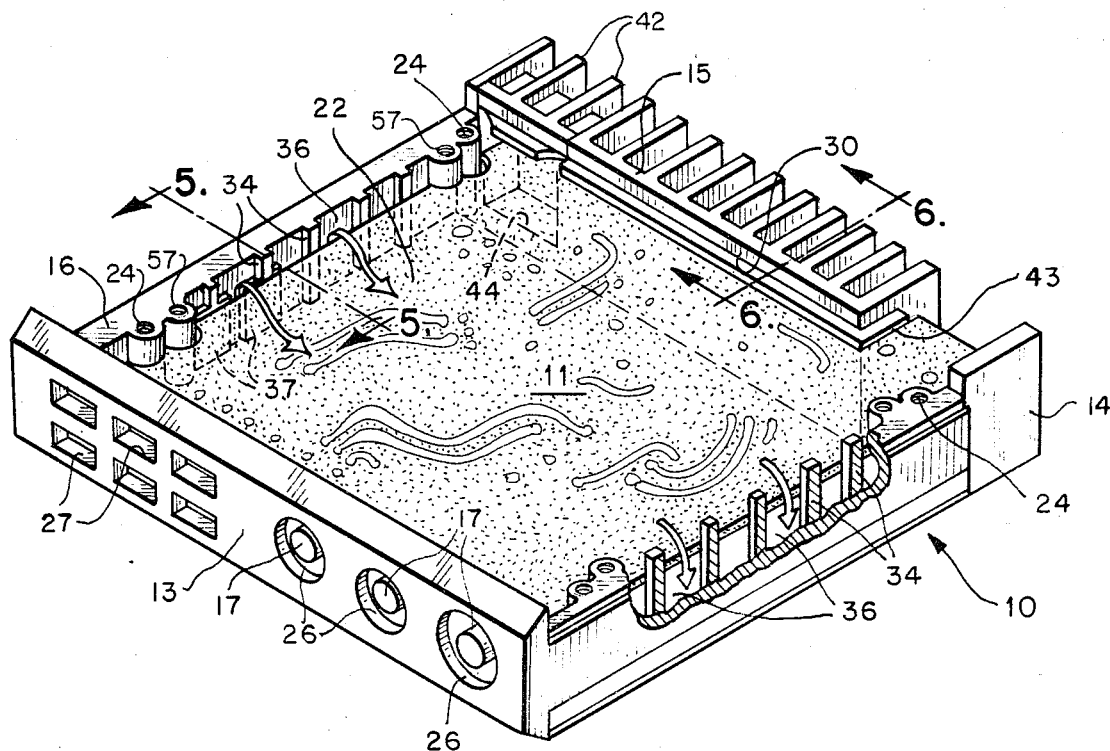
FIG. 4 is a perspective view of the underside of the housing with the bottom cover plate and one connector retaining element thereof removed.

In accordance with the invention, the interior surfaces 32 and 33 of sidewalls 14 and 16 include a plurality of parallel-spaced vertical ribs 34 which extend from the sidewalls inwardly toward circuit board 22. These ribs serve the dual functions of providing alignment and lateral support for insertion and mounting of circuit board 22, and of defining a number of air passageways 36 (FIG. 4) between the ribs 34, the circuit board 22, and sidewalls 14 and 16. As illustrated in FIG. 4, these passageways allow for the convective passage of air between the top and bottom surfaces of circuit board 22 for improved cooling of the components mounted on the circuit board.

Figure 5:
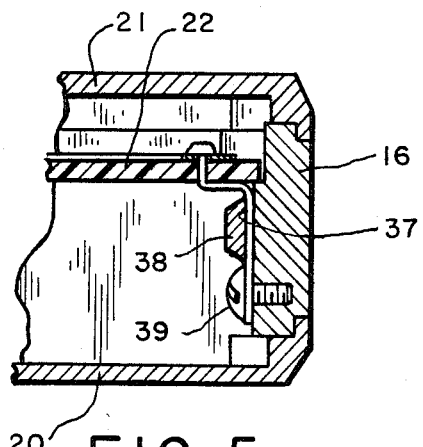
FIG. 5 is an enlarged cross-sectional view of the transceiver taken along line 5—5 of FIG. 4 showing mounting details on the circuit board.
Figure 6:
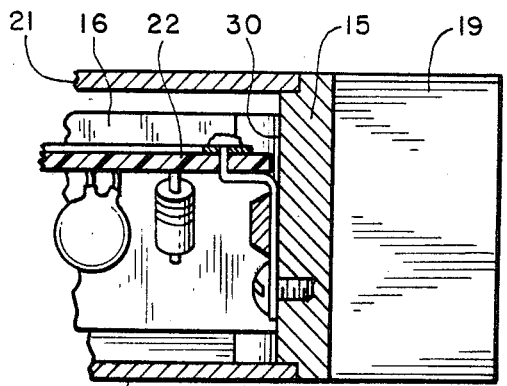
FIG. 6 is an enlarged cross-sectional view taken along line 6—6 of FIG. 4 showing additional mounting details of the circuit board.

Sidewalls 14 and 16 may include abutments 37 for the purpose of providing component mounting means for heat generating electrical components. These abutments allow for placement of the electronic components at areas other than the rear of the circuit board, thereby simplifying the design of the printed circuit board. FIG. 5, a cross-sectional view of sidewall 16, illustrates a rectifier 38 mounted by a machine screw 39 on an abutment 37 projecting outwardly from sidewall 16. Heat generated by rectifier 38 during operation is transferred through sidewall of the housing member 12 to the fins 19 at the rear of the housing member. Thicker portions of the sidewalls may also include posts 57 to which the circuit board 22 can be mounted by suitable attachment means such as by machine screws 58.

The housing member 12, and cover plates 20 and 21 of the housing are cast as interlocking elements so that when assembled there are no openings in the housing to allow contamination of circuit board 22 by moisture, particulate matter, grease or other contaminants. Only two molds are required to produce the three components of the housing, one for the housing member, and one for both the top and lower cover plates, allowing for simplification in manufacturing the housing. Although in the embodiment illustrated the top and bottom cover plates 20 and 21 are secured to housing member 12 by machine screws 23 which are threaded into apertures 24, it will be understood that other connection means, such as riveting, welding, or soldering, may be used instead.

In further accord with the invention, the lower cover plate 21 (shown on top in FIG. 3 for ease of illustration) holds in place two identical die-cast connector retainer members 40 and 41. The connector retainer members have integral fins 42 as part of their structure so that when seated in rear sidewall 15, the rear of the housing comprises a continuous arrangement of heat dissipating fins. The retainer members 40 and 41 are received within respective slots or notch shaped opening 43 and 44 on rear sidewall 15. Each of these openings, which are shown in the Figures as rectangular channels 54 and 55 (FIG. 3) extending through the rear sidewall 15, provides a notch in that wall. Each notch receives a portion of the circuit board 22 (FIG. 4) which may contain external connectors 45 and 46 positioned upon the circuit board in close proximity and in alignment with the rear sidewall openings. Additionally, each notch receives the portion of the external connector that extends through the opening to the exterior of the housing 10. As can be seen in FIGS. 2 and 3, each opening 43 and 44 begins at the rim of a sidewall 14, 16 and rear sidewall 15 and extends to the bottom on the housing member 12 of the housing. The opening is closed (FIG. 2) when the lower cover plate 21 is secured to the housing member 12.

Connectors 45 and 46 may be of the type commonly used for RF and external power. The stem, or that portion of each connector 45, 46 that extends from the circuit board 22 through the channels 55, 54 to the exterior of the housing 10 is secured to the housing member 12 by connector retaining members 40 and 41. These connector retaining members 40 and 41 serve to retain connectors 45 and 46 securely in position, allowing the connectors to be mounted directly on the circuit board, without subjecting the circuit board to mechanical stress. To this end the connector retaining members 40 and 41 are formed for interlocking engagement between both the rear sidewall 15 of housing member 12 and the lower cover plate 21, and may each include a tab 47 (FIG. 3) for engaging cover plate 21, and tabs 50 and 51 (FIG. 2) for engaging rear sidewall 15, respectively. A semi-annular slot 52 located between the lower engagement tabs 50 and 51 of each retaining member hold the associated connector in place by engaging the stem of the connector. To this end, slots 52 and 53 are preferably complimentary in configuration to the external configuration of the connector. The connector retaining members 40 and 41 are held in place by tabs 50 and 51, which interlock with channels within slots 43 and 44, and by the upper engagement tabs 47, which interlock with cover plate 21.

While a particular embodiment of the invention has been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

We claim:

1. An electronic equipment housing comprising:
    a circuit board having electrical circuitry thereon which dissipates heat;
    a housing member having a plurality of side walls defining a compartment having an opening at one end for receiving said circuit board;
    cover means overlying said opening to close said compartment; and
    mounting means mounting said circuit board within said compartment said mounting means including a plurality of ribs integrally formed in said housing member in the inside surface of at least one of said side walls, each of said ribs projecting from said inside surface into engagement with the periphery of said circuit board so as to space said circuit board from said surface to form a plurality of convective air passages between said circuit board and said surface allowing air to flow from one side of said circuit board to the other.

2. An electronic equipment housing as defined in claim 1 wherein said circuit board is generally rectangular and said housing member has a front sidewall, a rear sidewall, a left sidewall and a right sidewall forming a rectangular compartment receiving said circuit board.

3. An electronic equipment housing as defined in claim 1 wherein said housing member comprises a one-piece molded component die-cast from a metallic material.

4. An electronic equipment housing comprising:
a circuit board having electrical circuitry thereon which dissipates heat and which includes at least one electrical connector projecting from the periphery thereof;
a housing member comprising a plurality of sidewalls defining a compartment at one end for receiving said circuit board, and a rim around said opening, said housing member having at least one opening in at least one of said sidewalls dimensioned to receive said connector, said opening extending from said rim and defining a notch, said notch being positioned with respect to said circuit board to recieve said connector when said circuit board is received in said compartment;
a retaining member received within said notch between said connector and said rim retaining said connector within said notch;
cover means overlying said rim and said opening to retain said retaining member in said notch and enclosing said circuit board within said compartment; and
mounting means mounting said circuit board within said compartment, said mounting means including a plurality of ribs on the inside surface of at least one of said sidewalls, said plurality of ribs projecting from said inside surface into abutting engagement with the periphery of said circuit board to maintain said circuit board in alignment relative to said base member and forming a plurality of convective air passages between said board and said inside surface allowing air to flow between one side of said board and the other.

5. An electronic equipment housing as defined in claim 4 wherein said circuit board is generally rectangular, and said housing member has a front sidewall, a rear sidewall, a left sidewall and a right sidewall forming a rectangular compartment receiving said circuit board.

6. An electronic equipment housing as defined in claim 4 wherein said housing member comprises a one-piece molded component die-cast from a metallic material.

* * * * *